United States Patent
Yoon et al.

(10) Patent No.: US 6,316,294 B1
(45) Date of Patent: Nov. 13, 2001

(54) THIN FILM TRANSISTOR AND A FABRICATING METHOD THEREOF

(75) Inventors: Jin-Mo Yoon, Seoul; Dae-Gyu Moon, Anyang-shi, both of (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/604,393

(22) Filed: Jun. 27, 2000

Related U.S. Application Data

(62) Division of application No. 09/457,389, filed on Dec. 9, 1999, now Pat. No. 6,188,108.

(30) Foreign Application Priority Data

Dec. 9, 1998 (KR) .................................................. 98-53948

(51) Int. Cl.$^7$ .................................................. H01L 21/00
(52) U.S. Cl. ......................... 438/149; 438/151; 438/161; 438/153
(58) Field of Search .................................... 438/149, 154, 438/163, 164, 165, 166, 151, 218, 456, 422; 257/57–62, 66, 72, 347, 349, 350, 351, 352, 353, 354

(56) References Cited

U.S. PATENT DOCUMENTS 6,146,928 * 11/2000 Ishiguro et al. ..................... 438/151

* cited by examiner

Primary Examiner—Olik Chaudhuri
Assistant Examiner—Theresa T. Doan
(74) Attorney, Agent, or Firm—Long Aldridge & Norman LLP

(57) ABSTRACT

The present invention relates to a thin film transistor and a fabricating method thereof which improve device characteristics by forming a substance layer such as a vacuum layer or an air layer, which has a remarkable characteristic of insulation, on an active layer. The present invention includes an insulated substrate, an active layer on the insulated substrate wherein the active layer has a source region, a channel region and a drain region, a gate insulating layer having an inner space on the channel region, and a gate electrode on the gate insulating layer over the channel region. And, the present invention includes the steps of forming an active layer on an insulated substrate, forming a gate insulating layer having an inner space on the active layer, forming a gate electrode on the gate insulating layer, and forming a source region and a drain region in the active layer by doping the substrate including the active layer with impurities.

8 Claims, 14 Drawing Sheets

THIN FILM TRANSISTOR AND A FABRICATING METHOD THEREOF

This application is a division of application Ser. No. 09/457,389 filed on Dec. 9, 1999 now U.S. Pat. No. 6,188,108.

BACKGROUND OF THE INVENTION

1. Field of Invention

The present invention relates to a thin film transistor and a fabricating method thereof which improve device characteristics by forming a substance layer such as a vacuum layer or an air layer, which has a remarkable characteristic of insulation, on an active layer.

2. Discussion of Related Art

As far as a thin film transistor(hereinafter abbreviated TFT) which becomes a crucial part of a pixel array of an active matrix liquid crystal display is concerned, an amorphous silicon layer which enables to be deposited on a wide area as swell as to be produced at a low temperature for a mass production is used for an active layer.

For the present, a driver and a pixel array are required to be integrated simultaneously. There is a certain limitation of electrical mobility of amorphous silicon for a device having a fast operation speed. That's why techniques of fabricating a TFT of low temperature polycrystalline silicon of which electrical mobility is excellent are currently studied.

The methods of forming a polycrystalline silicon layer are largely divided into a high temperature process which deposits silicon of a polycrystalline state and a low temperature process which deposits amorphous silicon and then crystallizing the amorphous silicon into a polycrystalline state by annealing. In the latter method, after an amorphous silicon layer has been deposited at around 350 C., the amorphous silicon layer is crystallized by applying energy such as laser. The crystallization of silicon proceeds by growing silicon grains. One silicon grain collides into another grains nearby to terminate its growth so that grain boundaries are generated among the silicon grains.

FIGS. 1A to FIGS. 1D show cross-sectional views of fabricating a TFT according to a related art.

Referring to FIGS. 1A, after a buffer layer 10 of silicon oxide or silicon nitride has been formed on an insulated substrate 100, an amorphous silicon layer is deposited on the buffer layer 10. Then, the amorphous silicon layer is crystallized by laser energy. An active layer 12 is formed by patterning the crystallized silicon layer by photolithography.

Referring to FIG. 1B, an insulating layer and an electrically-conductive layer are deposited successively on the active layer 12. A gate electrode 15 is patterned by etching the electrically-conductive layer by photolithography. A gate insulating layer 13 is patterned by etching the insulating layer in use of the gate electrode 15 as an etch mask.

Referring to FIG. 1C, a source region 12S and a drain region 12D as impurity regions are formed by doping the exposed surface of the active layer 12 with impurities. An unexplained sign of '12C' indicates a channel region.

Referring to FIG. 1D, a protecting layer 16 is deposited over a whole surface of the substrate. Contact holes exposing portions of the source and drain regions 12S and 12D are formed by etching predetermined portions of the protecting layer 16 by photolithography. After an electrically-conductive layer has been deposited over the substrate, a source electrode 17S and a drain electrode 17D are formed by etching the electrically-conductive layer by photolithography.

As mentioned in the above description, a polycrystalline silicon layer is formed by depositing an amorphous silicon layer on an insulated substrate at low temperature and by crystallizing the amorphous silicon layer by the irradiation of a laser beam thereon.

Once the laser beam is irradiated to the amorphous silicon layer, most of the beam energy is absorbed by the amorphous silicon layer. Thus, the silicon layer is liquidized selectively or completely. Then, the liquidized silicon layer is cooled immediately. In this process, the remaining or generated silicon particles work as crystallizing nuclei. In this case, the silicon is crystallized by the growth of silicon grains. The growth of each silicon grain is terminated by the collisions of the neighbouring grains wherein the collisions generate grain boundaries.

The existence of the boundaries in a polycrystalline silicon layer results in a rugged surface of the silicon layer. Thus, an active layer of which surface is not smooth is formed. Thereby, a gate insulating layer of which surface is contacted with the active layer shows a poor interface characteristic. Such poor interface characteristic between the active layer and the gate insulating layer causes the increases of breakdown of the thin layer, a flat band shift and an S-factor so that the characteristics of a TFT may be ruined.

SUMMARY OF THE INVENTION

Accordingly, the present invention is directed to a thin film transistor and a fabricating method thereof that substantially obviate one or more of the problems due to limitations and disadvantages of the related art.

The object of the present invention is to provide a thin film transistor and a fabricating method thereof by forming a space between a channel region and a gate insulating layer to improve an interface characteristic between an active layer and the gate insulating layer, thereby improving device characteristics.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes an insulated substrate, an active layer on the insulated substrate wherein the active layer has a source region, a channel region and a drain region, a gate insulating layer having an inner space on the channel region, and a gate electrode on the gate insulating layer over the channel region.

In another aspect, the present invention includes the steps of forming an active layer on an insulated substrate, forming a gate insulating layer having an inner space on the active layer, forming a gate electrode on the gate insulating layer, and forming a source region and a drain region in the active layer by doping the substrate including the active layer with impurities.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

DETAILED DESCRIPTION OF PREFERRED EMBODIMENTS

Reference will now be made in detail to the preferred embodiments of the present invention, examples of which are illustrated in the accompanying drawings.

FIG. 2A to FIG. 2G show cross-sectional views of fabricating a TFT according to a first embodiment of the present invention. The left parts of the drawings illustrate the steps of fabrication and the right show layouts corresponding to the left.

Figure 1A:
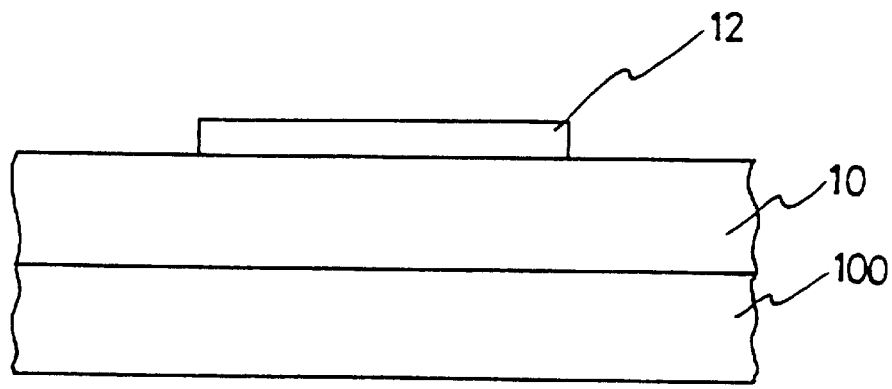
FIG. 1A to FIG. 1D show cross-sectional views of fabricating a TFT according to a related art.
Figure 1B:
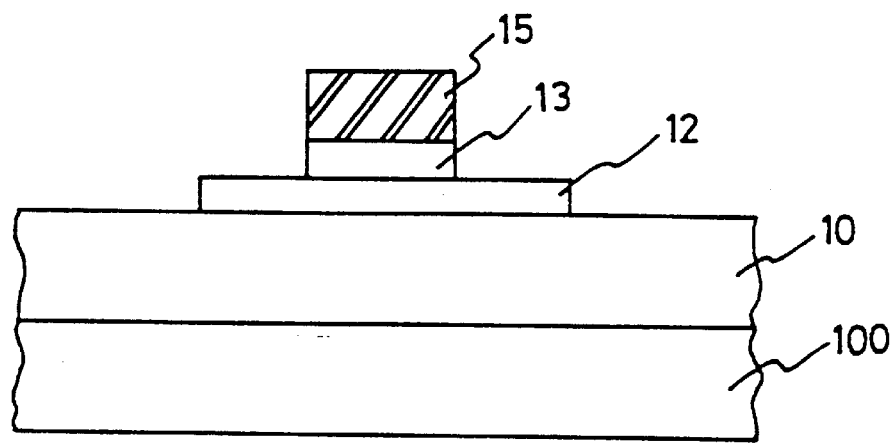
Figure 1C:
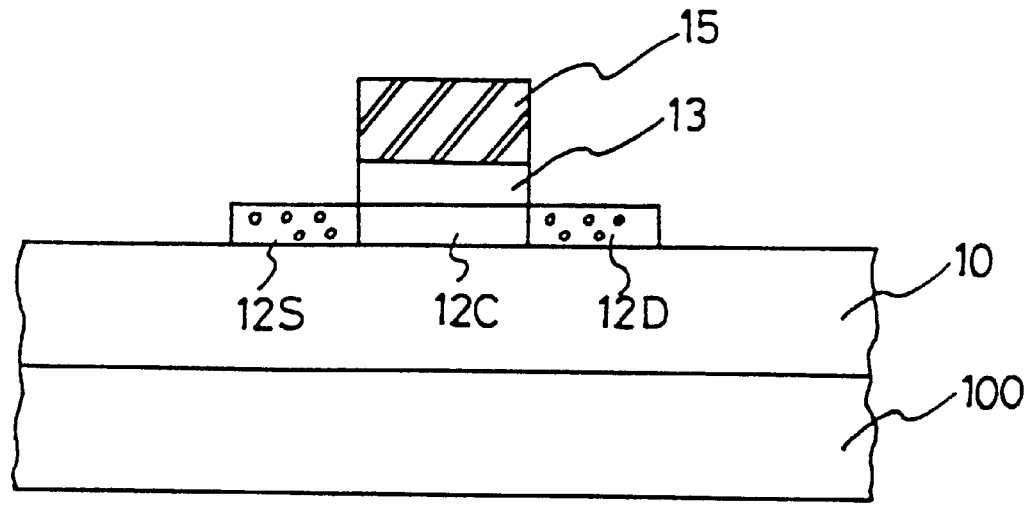
Figure 1D:
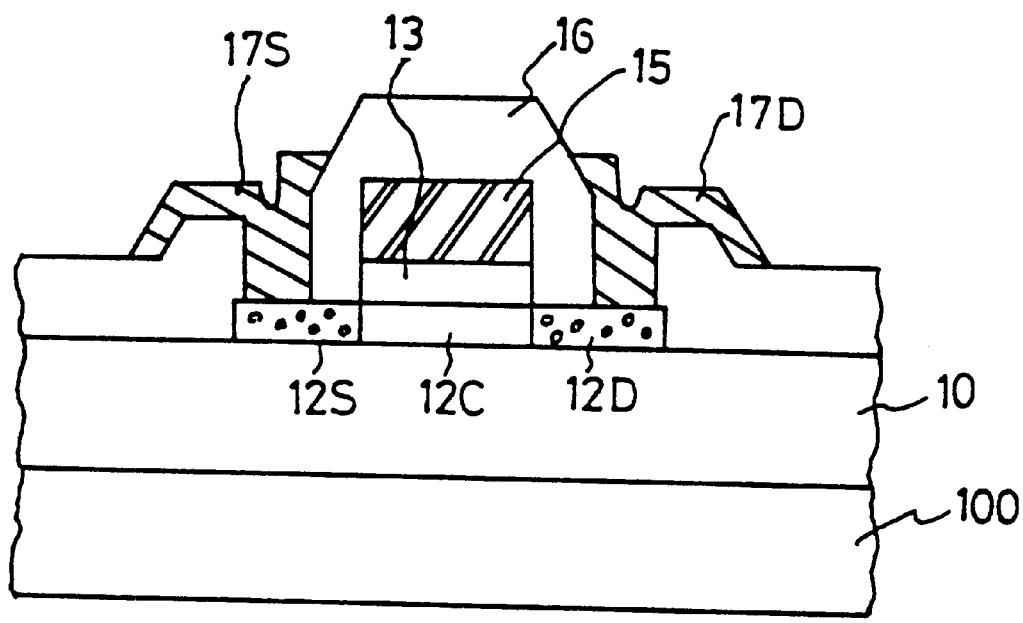
Figure 2A:
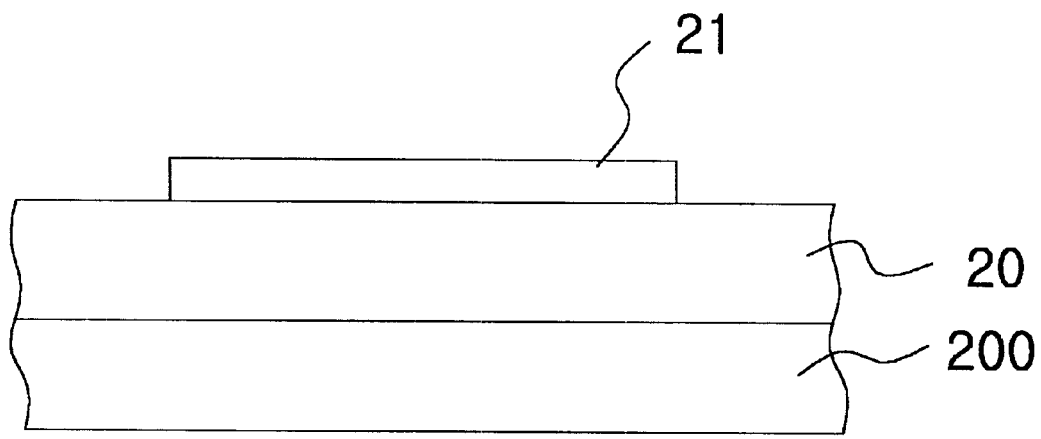
FIG. 2A to FIG. 2N show cross-sectional and top views of fabricating a TFT according to a first embodiment of the present invention.

Referring to FIG. 2A, a buffer layer 20 3000 to 4000 Å thick is formed on an insulated substrate 200. Then, an active layer 21 of polycrystalline silicon 500 to 1000 Å thick is formed on the buffer layer 20. In this case, the insulated substrate 200 may be glass, quartz or the like which is ray-transmissive.

The active layer 21 is formed by depositing an amorphous silicon layer on the buffer layer 20 by plasma enhanced chemical vapor deposition (hereinafter abbreviated PECVD) or the like, by crystallizing the amorphous silicon layer by means of growing silicon grains through the irradiation of a laser beam and by patterning a polycrystalline silicon layer, which has been crystallized from the amorphous silicon layer, by photolithography.

The buffer layer 20, which keeps the impurities in the insulated substrate 200 from penetrating into the silicon layer during the crystallization of the amorphous silicon layer, prevents the degradation of the crystalline characteristics of the silicon layer. The buffer layer may be formed by depositing silicon oxide or silicon nitride by PECVD or APCVD.

Figure 2B:
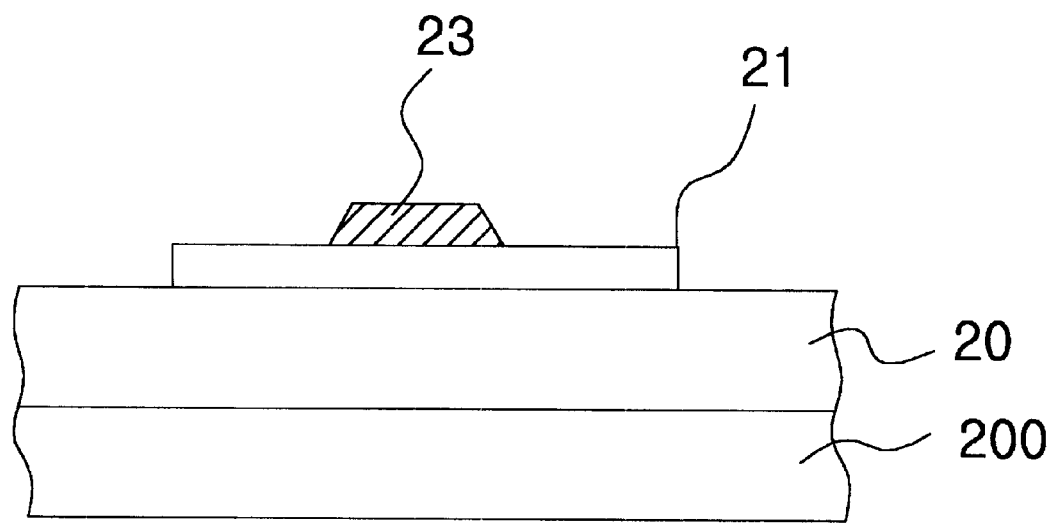

Referring to FIG. 2B, a space-providing substance layer 23 200 to 300 Å thick is formed on the active layer 21.

The major object of the present invention is to prevent the degradation of an interface characteristic between the active layer 20 and a gate insulating layer wherein the degradation is caused by the rough surface of the active layer 20 of polycrystalline silicon having been crystallized. Thus, it is desirable to improve the interface characteristic between a channel region of the active layer and the gate insulating layer so as to ameliorate the characteristics of a TFT. Therefore, it is advantageous to have the space-providing substance layer located onto the channel region of the active layer 21.

The space-providing substance layer 23 may be attained by depositing metal such as Mo, Cu, Al or Ta over the substrate and by patterning the metal by photolithography. Providing a space between the active layer 21 and the gate insulating layer, the space-providing substance layer 23 is made of a substance which is removed by any etchant which has selectivity from the active layer 21 as well as the gate insulating layer.

In this case, the sides of the space-providing substance layer 23 may be vertical or slant. It is advantageous for the side of the substance layer 23 to have a slant degree which would not give a stress on a following layer such as the gate insulating layer provided that the side of the substance layer 23 becomes slant.

Figure 2C:
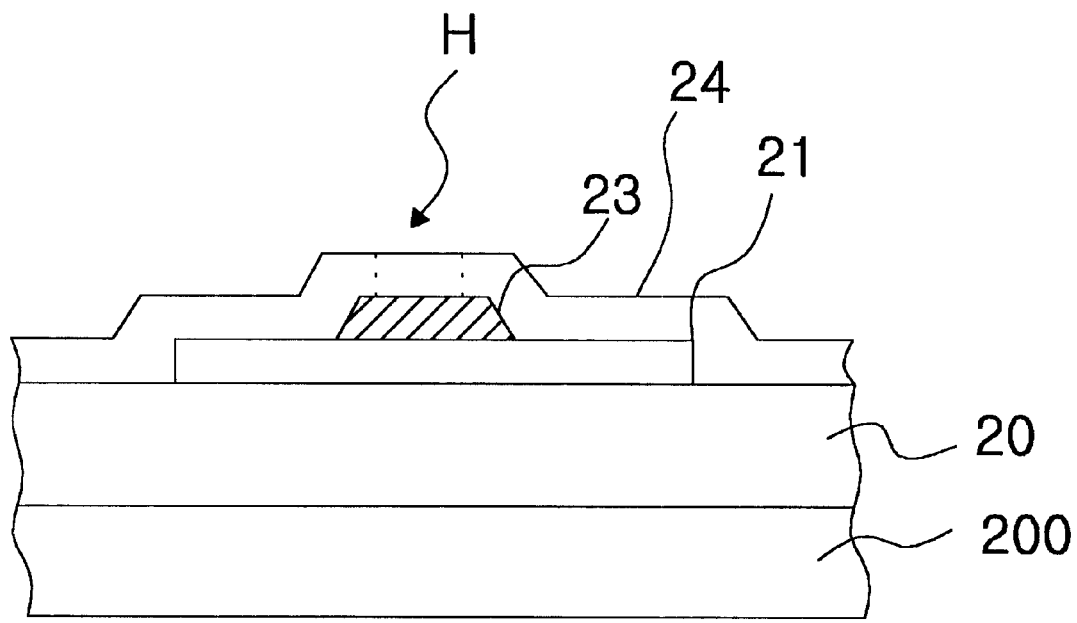

Referring to FIG. 2C, after a gate insulating layer 24 1000 to 2000 Å thick has been deposited over the substrate, an etching hole H exposing a portion of the space-providing substance layer 23 is formed by etching a portion of the gate insulating layer 24 by photolithography. At least one etching hole through which an etchant to remove the space-providing substance layer 23 only is penetrated may be formed. The space-providing substance layer 23 is removed swiftly owing to the fast penetration of the etchant provided that a plurality of the etching holes are formed.

Figure 2D:
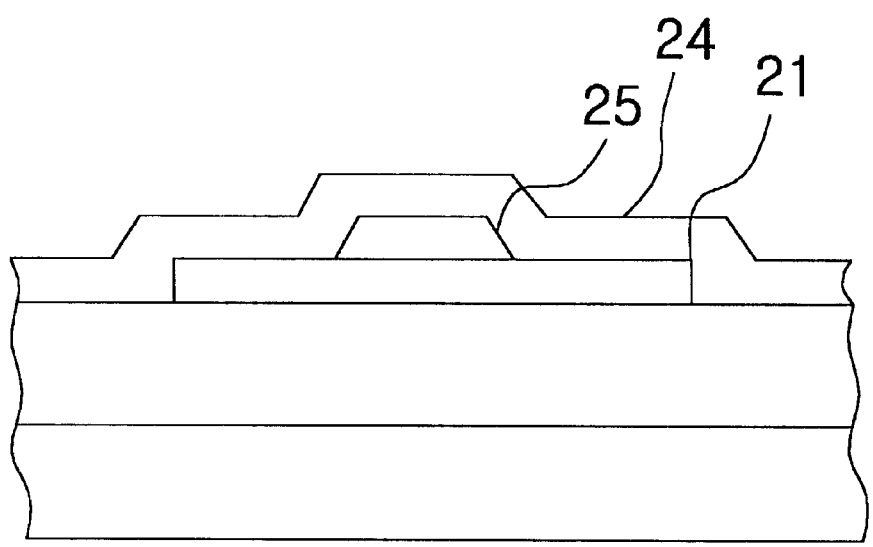

Referring to FIG. 2D, a space 25 is generated between the active layer 21 and the gate insulating layer 24 by removing the space-providing substance layer 23 through the etching hole H in use of an etchant which removes the space-providing substance layer selectively.

As the space-providing substance layer 23 is surrounded by the gate insulating layer 24 and the active layer 21, it is favorable to use an etchant of which etching selectivity is excellent only to the space-providing substance layer 23 to be removed. Therefore, the space 25 surrounded by the gate insulating layer 24 and the active layer 21 is provided stably as soon as the space-providing substance layer 23 is removed only by the etchant.

Figure 2E:
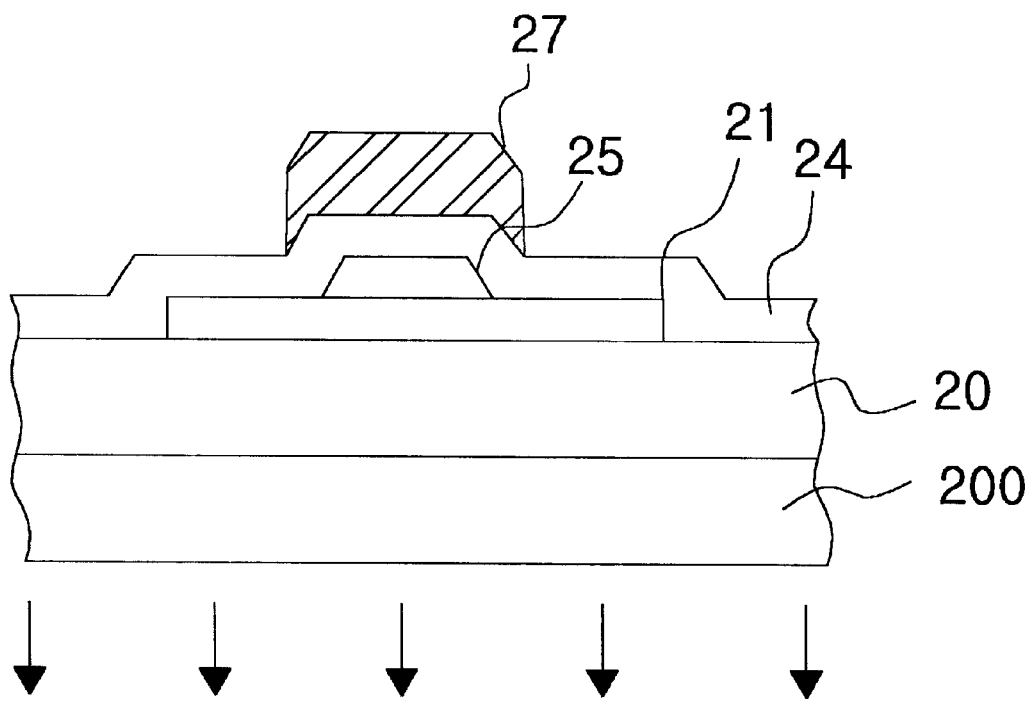

Referring to FIG. 2E, a gate electrode 27 2500 to 3500 Å thick is formed on the gate insulating layer 24.

The gate electrode 27 may be formed by depositing a conventional electrically-conductive layer of Mo, Cu, Al, Ta or the like over the substrate and by patterning the electrically-conductive layer by photolithography. In this case, the gate electrode 27 is formed to be largely overlapped with the space 25. When a device is fabricated, as shown in the drawing, it is advantageous for the gate electrode 27 to be exactly overlapped with the space 25.

Figure 2F:
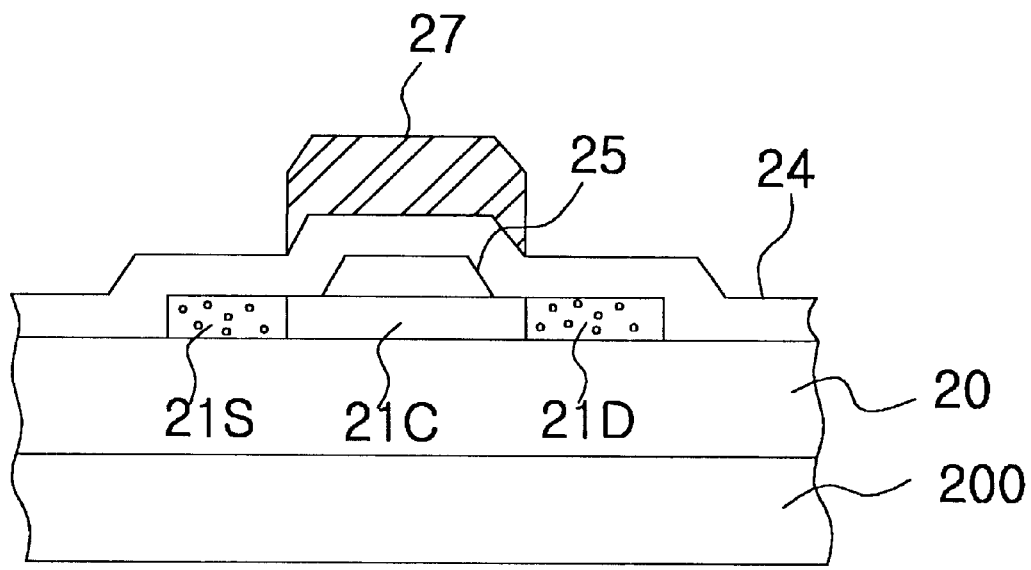

Referring to FIG. 2F, a source region 21S and a drain region 21D are formed in the active layer 21 by carrying out impurity doping step over the substrate. In this case, as the gate insulating layer 24 is located on the source and drain regions 21S and 21D, the acceleration pressure of impurities is controlled properly on the impurity doping step.

A channel region 21C is defined between the source and drain regions 21S and 21D. The space 25 is located on the channel region 21C in the structure of a TFT according to the present invention.

Figure 2G:
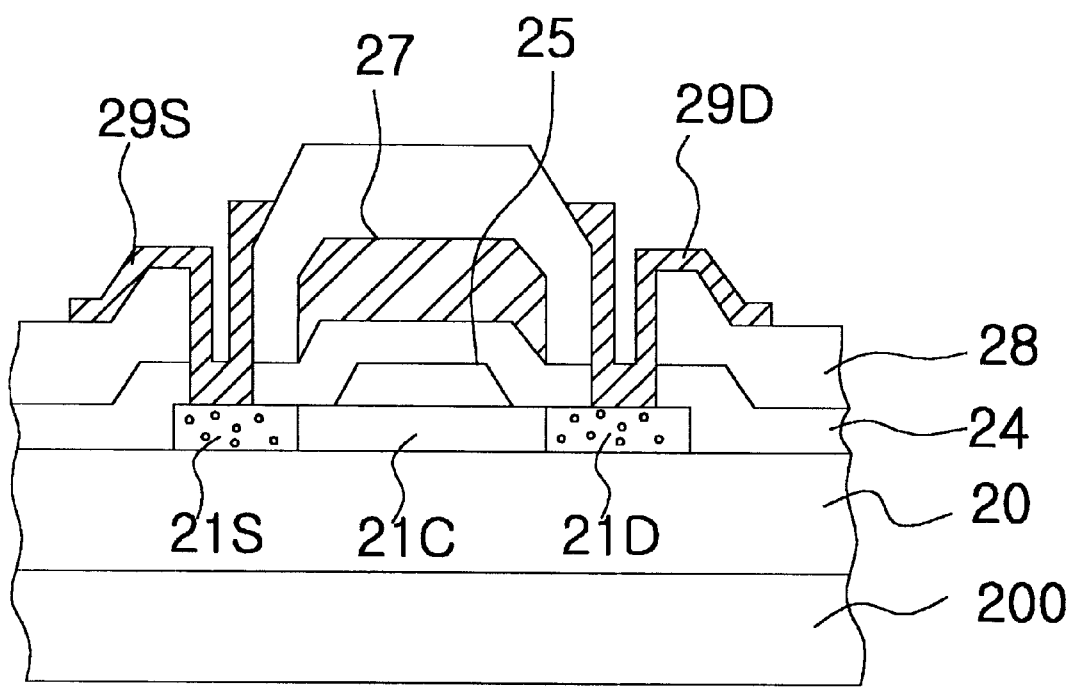
Figure 2H:
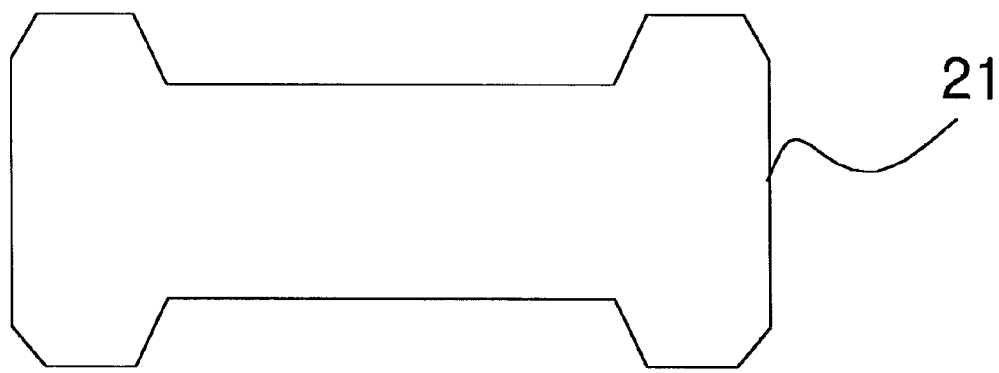
Figure 2I:
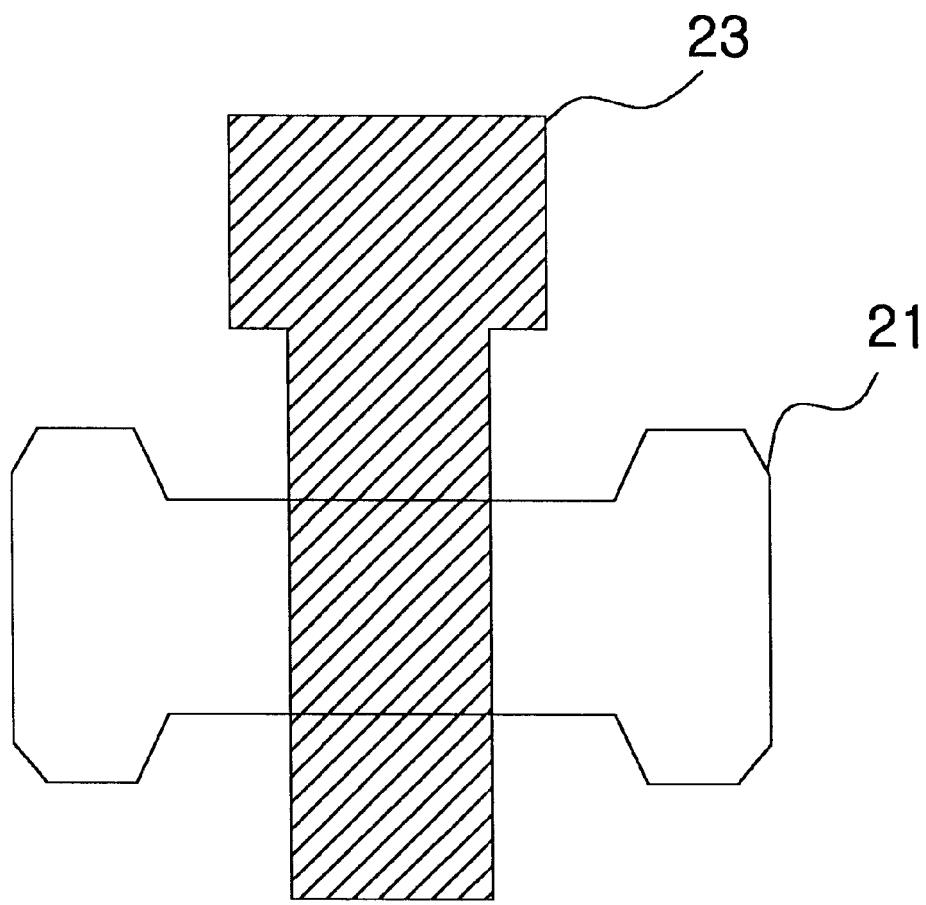
Figure 2J:
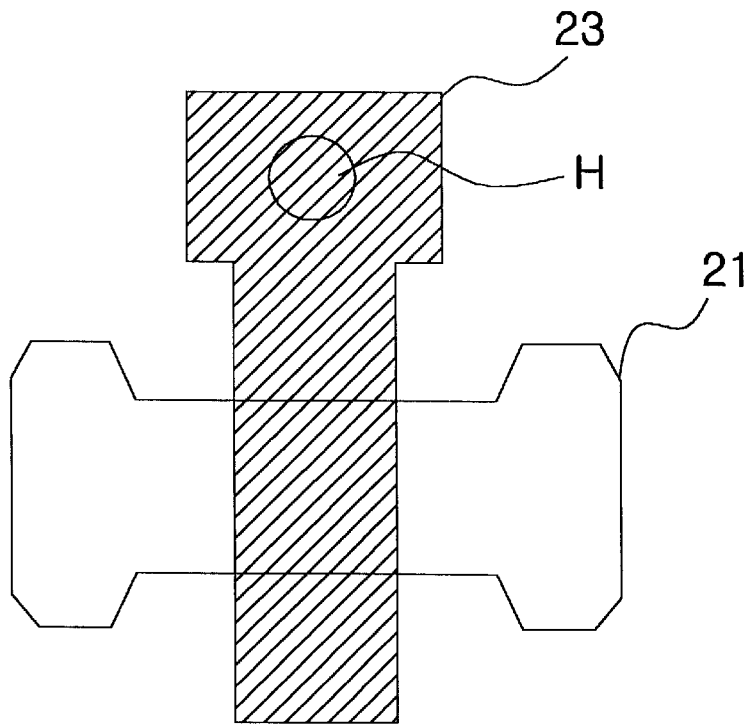
Figure 2K:
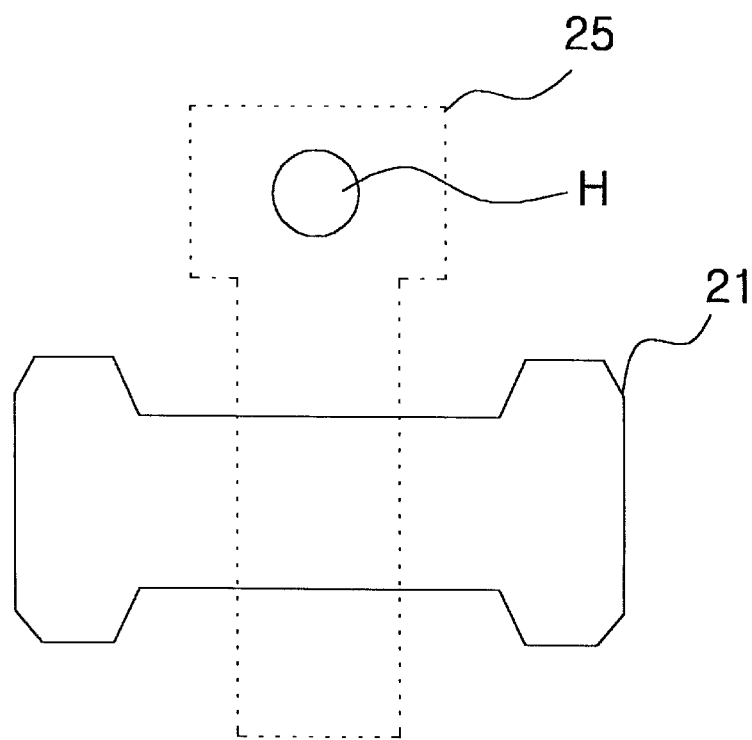
Figure 2L:
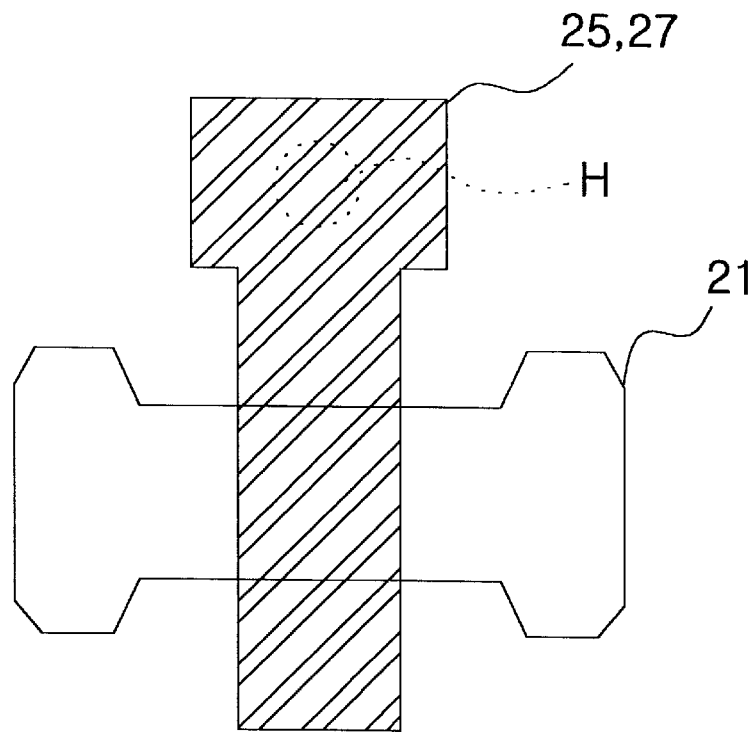
Figure 2M:
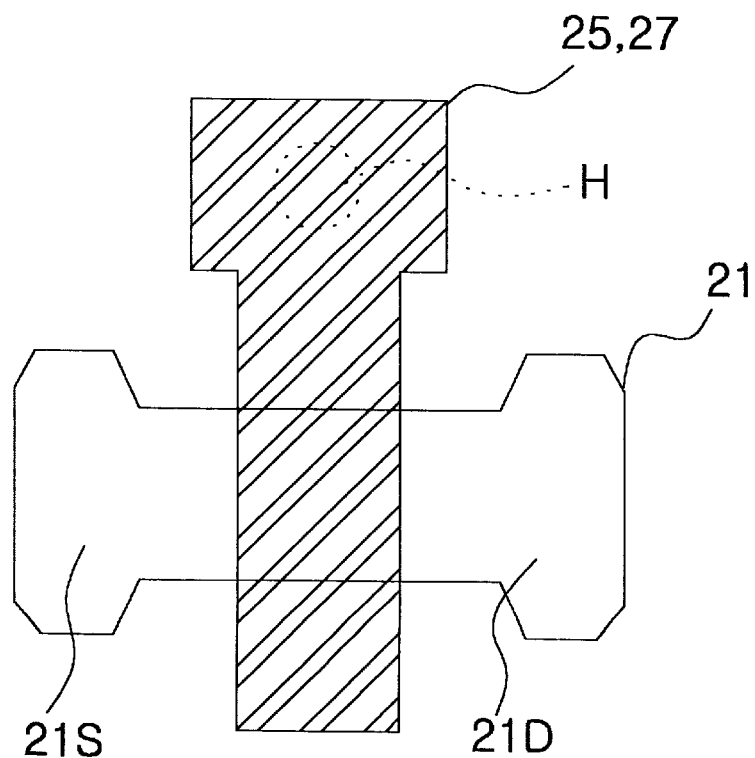
Figure 2N:
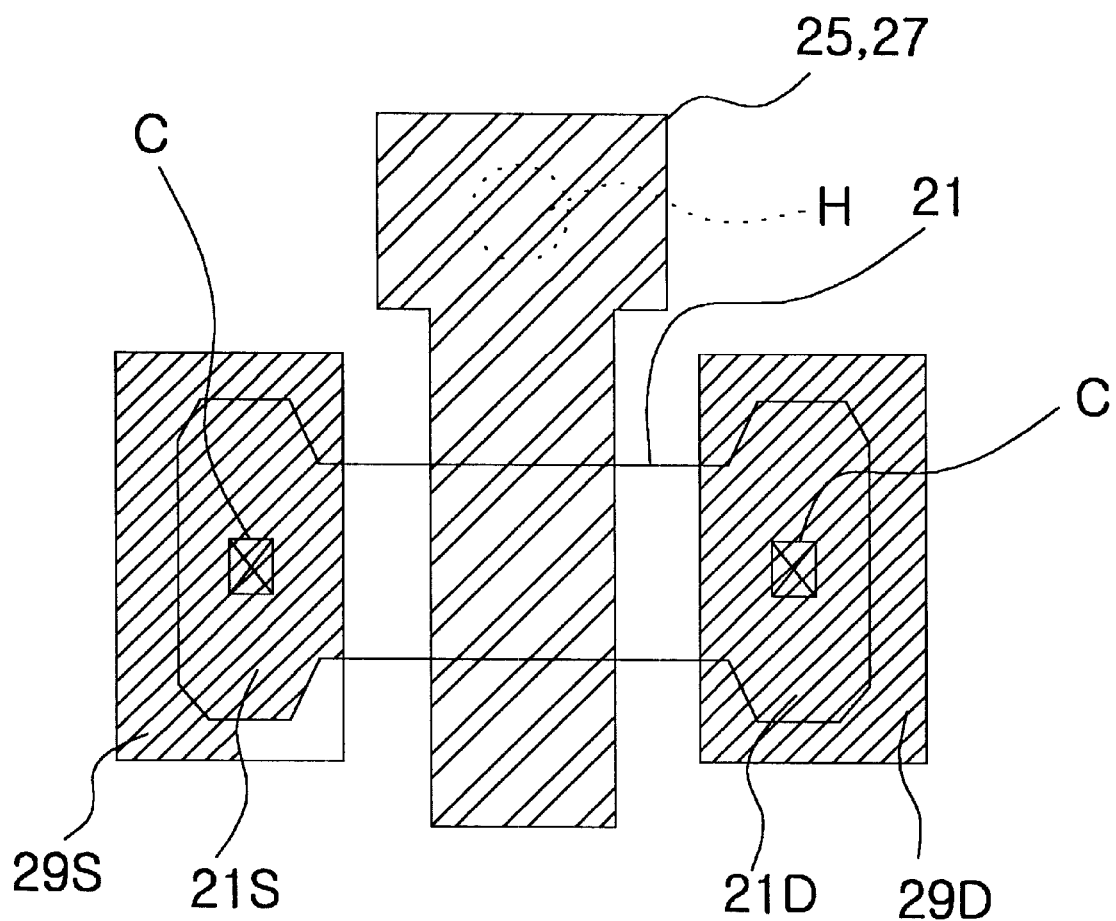

Referring to FIG. 2G, a passivation layer 28 is deposited over the substrate. Then, contact holes C exposing the source and drain regions 21S and 21D are formed by etching portions of the passivation layer 28 of an insulating substance and the gate insulating layer 24. After an electrically-conductive layer has been deposited over the substrate, a source electrode 29S connected to the source region 21S and a drain electrode 29D connected to the drain region 21D are formed by patterning the electrically-conductive layer by photolithography.

According the above-mentioned structure, the space 25 is located on the channel region 21C of the active layer 21 and the gate electrode 27 is located over the space 25. Namely, the channel region 21C of the active layer 21 is contacted with the space 25. The space 25 having little trap is an ideal insulating layer having no effect on the interface characteristics relating to the active layer. Therefore, a TFT of the present invention improves the interface characteristics of the channel region 21C in the active layer 21.

Figure 3:
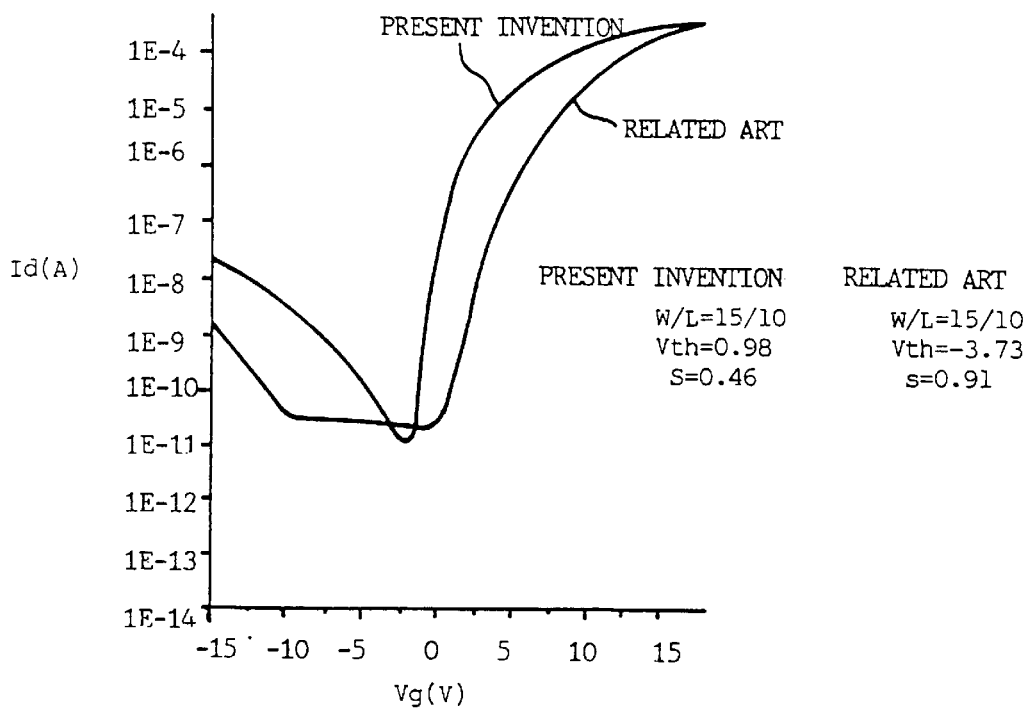
FIG. 3 to FIG. 5 show the comparative graphs of physical characteristics of the TFT's according to the first embodiment of the present invention and the related art.
Figure 4:
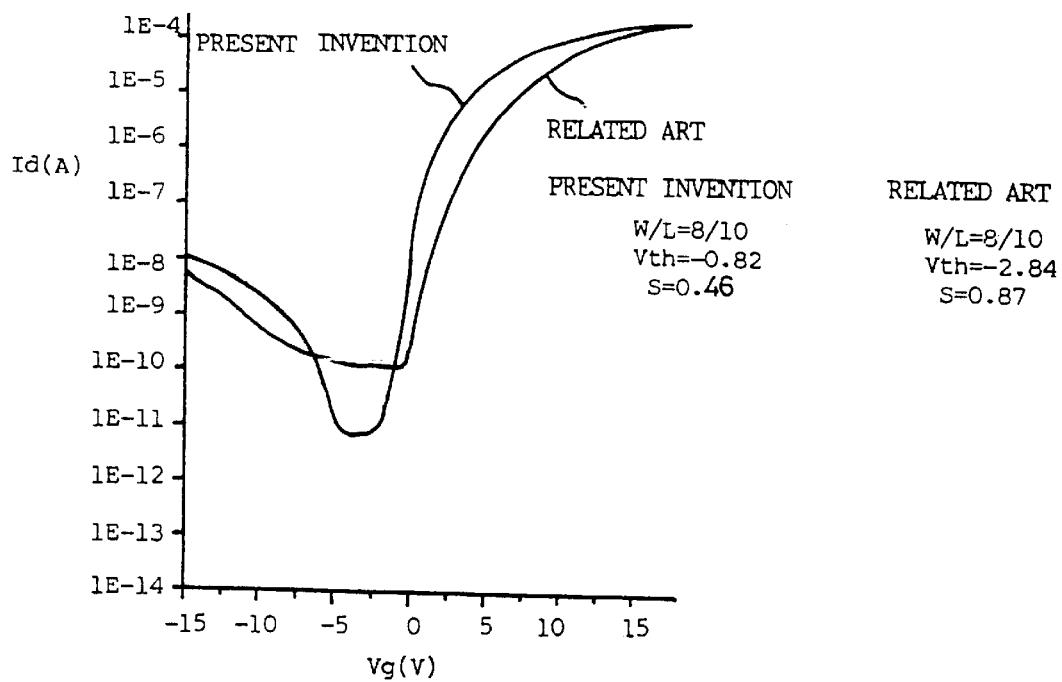
Figure 5:
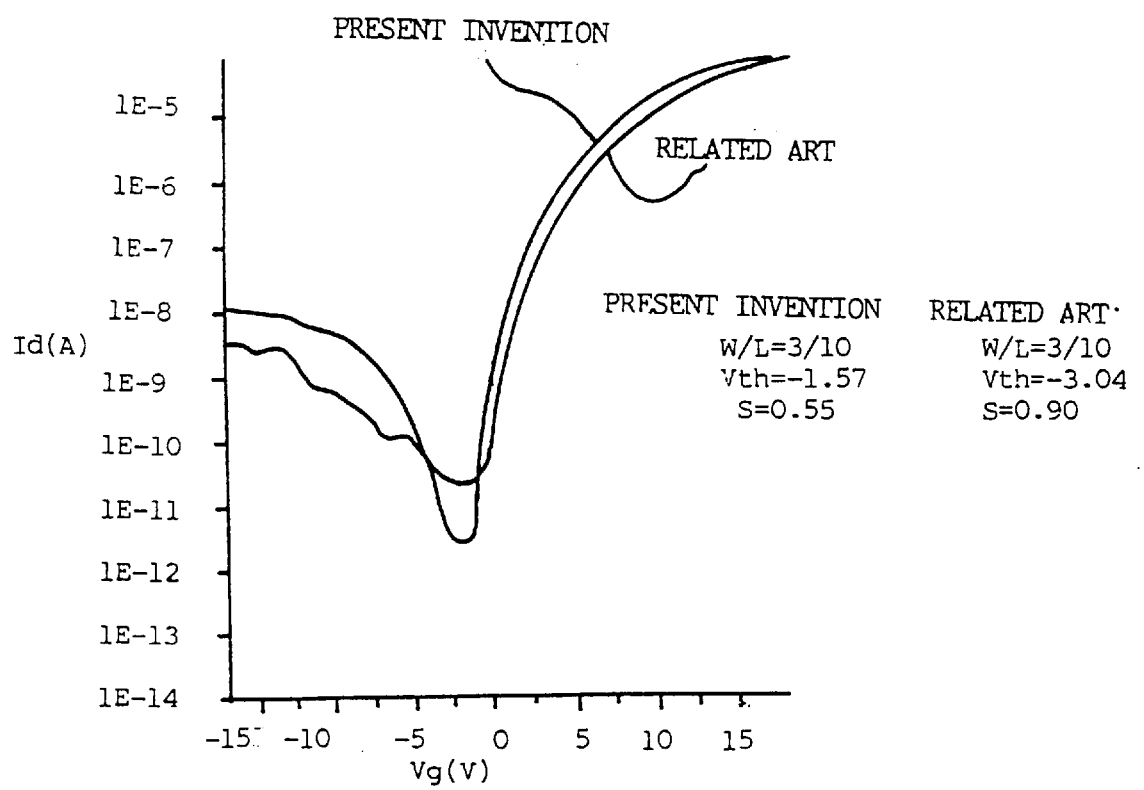

FIG. 3 to FIG. 5 show the comparative graphs of physical characteristics of the TFT's according to the first embodiment of the present invention and the related art, wherein drain current depends on gate voltage under the condition that drain voltage is 10V. And each size W/L of a TFT varies 15/10, 8/10 and 3/10 corresponding to FIG. 3 to FIG. 5.

Mobility of threshold voltage, S-factor and the tendency of flat band shift of a TFT of the present invention are lower than those of a TFT of the related art. Therefore, the characteristics of the TFT according to the present invention is superior to those of the related art.

Figure 6A:
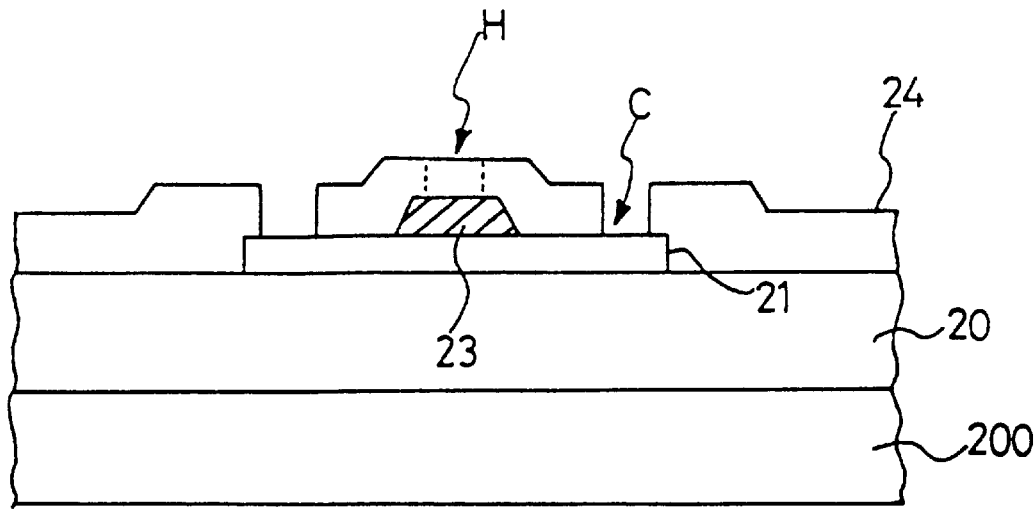
FIG. 6A to FIG. 6C show cross-sectional views of fabricating a TFT according to a second embodiment of the present invention.
Figure 6B:
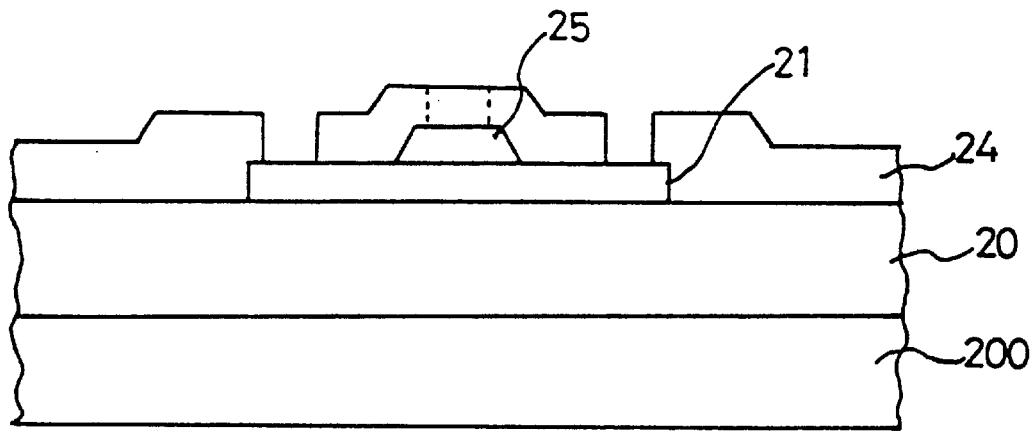
Figure 6C:
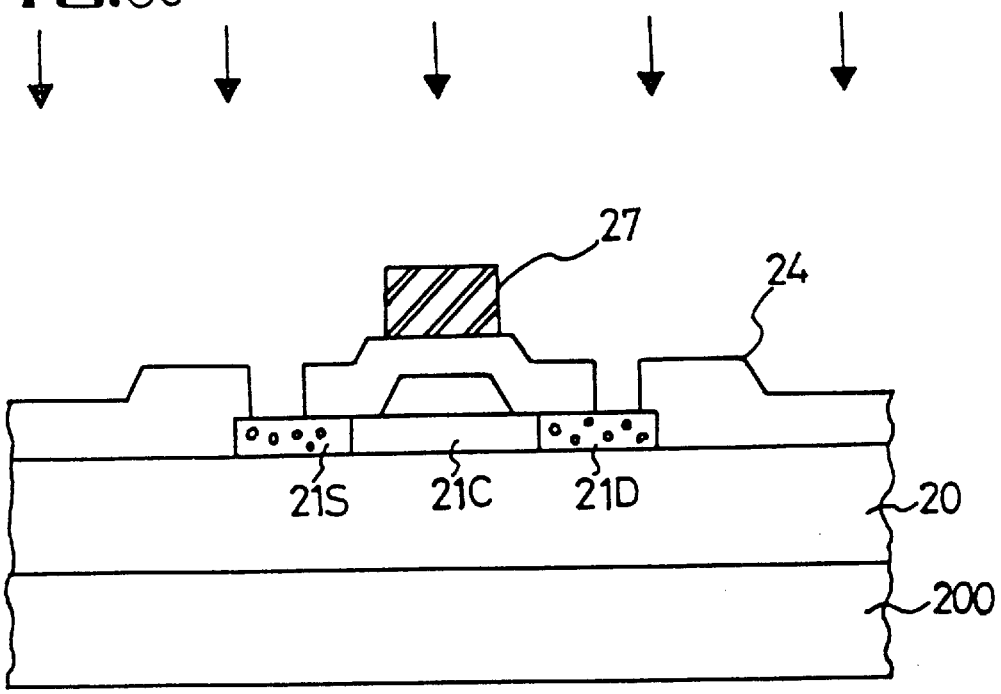

FIG. 6A to FIG. 6C show cross-sectional views of fabricating a TFT according to a second embodiment of the present invention wherein an etching hole and contact holes are formed simultaneously by a single etching step. For the convenience of explanation, the same signs are designated to the same elements of the first embodiment of the present invention.

Referring to FIG. 6A, after a buffer layer 20 has been formed on an insulated substrate 200, a space-providing substance layer 23 is formed on the buffer layer 20. Then a gate insulating layer 24 is deposited over the substrate. The steps of the second embodiment so far are identical to those of the first embodiment.

Then, an etching hole H exposing a portion of the space-providing substance layer 23 and contact holes C exposing portions of the source and drain regions of the active layer are formed simultaneously by etching the gate insulating layer 24.

Referring to FIG. 6B, a space 25 is formed between the active layer 21 and the gate insulating layer 24 by removing the space-providing substance layer which is exposed by the etching hole H in use of an etchant which removes only the space-providing substance layer selectively. The etchant, as mentioned, removes just the space-providing substance layer 23 selectively.

Referring to FIG. 6C, a gate electrode 27 is formed by depositing an electrically-conductive layer over the substrate including the gate insulating layer 24 and by patterning the electrically-conductive layer by photolithography. Then, a source region 21S and a drain region 21D are formed in the active layer 21 by doping the substrate with impurities. A channel region 21C is defined between the source and drain regions 21S and 21D in the active layer 21.

A passivation layer 28 is deposited as explained in the first embodiment of the present invention. Then, portions of the source and drain regions 21S and 21D are exposed by etching the passivation layer 28 by photolithography.

A source electrode 29S connected to the exposed source region 21S and a drain electrode 29D connected to the exposed drain region 21D are formed to complete a TFT as shown in FIG. 2F.

Figure 7:
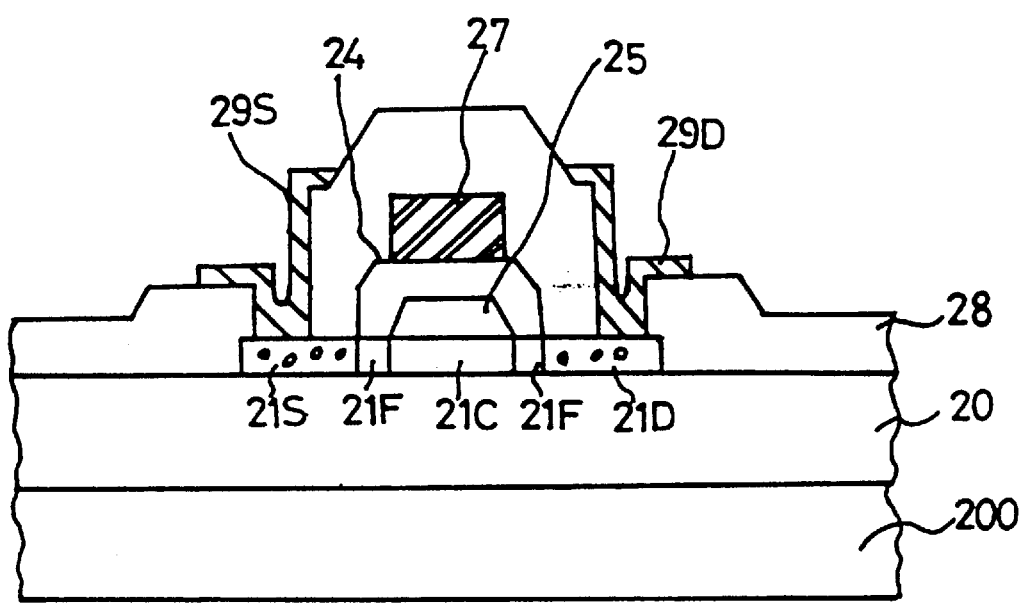
FIG. 7 shows a cross-sectional view of a TFT which is fabricated by a third embodiment of the present invention.

FIG. 7 shows a cross-sectional view of a TFT which is fabricated by a third embodiment of the present invention. The third embodiment of the present invention shows a TFT of which gate insulating layer covers just the space. For the convenience of explanation, the same signs are designated to the same elements of the first embodiment of the present invention.

The process of fabricating a TFT is carried out by the same method of the first embodiment. But, after the step of forming the gate electrode 28 (please refer to FIG. 2E) a gate insulating layer is formed to surround the space 25 only. Then, the following steps as shown in the first embodiment are carried out to fabricate a TFT which is shown in the drawing.

On the other hand, the third embodiment may be achieved by the process of the second embodiment. But, when the gate insulating layer 24 is etched to form an etching hole H and contact holes C (please refer to FIG. 6A), the gate insulating layer is etched to surround the space only without forming the contact holes by photolithography. Then, the following steps as shown in the second embodiment are carried out to fabricate a TFT which is shown in the drawing.

When the impurity doping steps are carried out in both above-explained processes, an offset region 21F is formed between the source region 21S and the channel region 21C or between the channel region 21C and the drain region 21D by controlling the impurity acceleration pressure to dope the source and drain regions 21S and 21D only with impurities.

Moreover, instead of the offset region 21F, a lightly doped drain region is formed by adjusting the impurity acceleration pressure to dope the source and drain regions 21S and 21D heavily with impurities and to dope the above-mentioned offset region 21F lightly with impurities.

As mentioned in the above description of the structure of the present invention, a channel region in the active layer is not directly contacted with a gate insulating layer by forming an active layer of polycrystalline silicon which is crystallized by laser beam irradiation and by leaving a space between the channel region of the active layer and the gate insulating layer. Therefore, the present invention improves the interface characteristics between the active layer and the gate insulating layer, thereby improving the TFT characteristics.

It will be apparent to those skilled in the art that various modifications and variations can be made in a thin film transistor and a fabricating method thereof of the present invention without departing from the spirit or scope of the inventions. Thus, it is intended that the present invention cover the modifications and variations of this invention provided they come within the scope of the appended claims and equivalents.

What is claimed is:

1. A method of fabricating a thin film transistor, comprising the steps of:

forming an active layer on an insulated substrate;

forming a gate insulating layer having an inner space on the active layer;

forming a gate electrode on the gate insulating layer; and forming a source region and a drain region in the active layer by doping the substrate including the active layer with impurities.

2. The method of fabricating a thin film transistor according to claim 1, wherein the side of the inner space is formed to be slant.

3. The method of fabricating a thin film transistor according to claim 1, the steps of forming the inner space, the gate insulating layer and the gate electrode further comprising the steps of:

forming a space-providing substance layer on the active layer;

forming a gate insulating layer covering the substrate including the space-providing substance layer;

forming an etching hole in the gate insulating layer wherein the etching hole exposes a portion of the space-providing substance layer;

forming an inner space surrounded by the gate insulating layer and the active layer by removing the space-providing substance layer in use of an etchant through the etching hole; and forming a gate electrode on the gate insulating layer.

4. The method of fabricating a thin film transistor according to claim 3, the method further comprising the step of etching the gate insulating layer by photolithography to leave the portion of the gate insulating layer surrounding the inner space only.

5. The method of fabricating a thin film transistor according to claim 4, wherein a high resistance region of which resistance is higher than that of the source or drain region is formed in the active layer under the gate insulating layer by adjusting impurity doping energy.

6. The method of fabricating a thin film transistor according to claim 3, wherein contact holes exposing regions to become source and drain regions in the active layer are formed as soon as the etching hole is formed.

7. The method of fabricating a thin film transistor according to claim 1, the steps of forming the inner space, the gate insulating layer and the gate electrode further comprising the steps of:

forming a space-providing substance layer on the active layer;

forming a gate insulating layer covering the substrate including the space-providing substance layer;

forming an etching hole exposing a portion of the space-providing substance layer by etching the gate insulating layer selectively and by leaving a portion of the gate insulating layer covering the space-providing substance layer only;

forming an inner space surrounded by the gate insulating layer and the active layer by removing the space-providing substance layer in use of an etchant through the etching hole; and forming a gate electrode on the gate insulating layer.

8. The method of fabricating a thin film transistor according to claim 7, wherein a high resistance region of which resistance is higher than that of the source or drain region is formed in the active layer under the gate insulating layer by adjusting impurity doping energy.

* * * * *